US008816476B2

(12) United States Patent
Mallikarjunaswamy

(10) Patent No.: US 8,816,476 B2
(45) Date of Patent: Aug. 26, 2014

(54) THROUGH SILICON VIA PROCESSING TECHNIQUES FOR LATERAL DOUBLE-DIFFUSED MOSFETS

(75) Inventor: Shekar Mallikarjunaswamy, San Jose, CA (US)

(73) Assignee: Alpha & Omega Semiconductor Corporation, Sunnyvale, CA (US)

( * ) Notice: Subject to any disclaimer, the term of this patent is extended or adjusted under 35 U.S.C. 154(b) by 335 days.

(21) Appl. No.: 13/095,539

(22) Filed: Apr. 27, 2011

(65) Prior Publication Data

US 2012/0273878 A1    Nov. 1, 2012

(51) Int. Cl.
| | |
|---|---|
| *H01L 29/40* | (2006.01) |
| *H01L 29/417* | (2006.01) |
| *H01L 21/74* | (2006.01) |
| *H01L 29/78* | (2006.01) |
| *H01L 21/768* | (2006.01) |
| *H01L 29/66* | (2006.01) |
| *H01L 29/08* | (2006.01) |
| *H01L 23/495* | (2006.01) |
| *H01L 29/45* | (2006.01) |
| *H01L 29/10* | (2006.01) |
| *H01L 29/06* | (2006.01) |

(52) U.S. Cl.
CPC ......... *H01L 29/7835* (2013.01); *H01L 29/0878* (2013.01); *H01L 23/49575* (2013.01); *H01L 29/4175* (2013.01); *H01L 21/743* (2013.01); *H01L 29/456* (2013.01); *H01L 29/782* (2013.01); *H01L 2924/0002* (2013.01); *H01L 21/76898* (2013.01); *H01L 29/1083* (2013.01); *H01L 29/0634* (2013.01); *H01L 29/66659* (2013.01); *H01L 23/49562* (2013.01); *H01L 29/78* (2013.01); *H01L 29/7839* (2013.01); *H01L 29/41766* (2013.01)
USPC ............ 257/621; 257/E29.116; 257/E29.119; 257/E29.121

(58) Field of Classification Search
USPC .................................. 257/E29.121, E29.122
See application file for complete search history.

(56) References Cited

U.S. PATENT DOCUMENTS

| | | | |
|---|---|---|---|
| 6,285,177 | B1 | 9/2001 | Mallikarjunaswamy et al. |
| 6,521,923 | B1 * | 2/2003 | D'Anna et al. ............... 257/288 |
| 6,583,476 | B1 | 6/2003 | Miller et al. |
| 6,650,165 | B1 | 11/2003 | Mallikarjunaswamy |
| 6,696,731 | B2 | 2/2004 | Mallikarjunaswamy |
| 6,815,800 | B2 | 11/2004 | Mallikarjunaswamy |
| 6,818,950 | B1 | 11/2004 | Mallikarjunaswamy |
| 6,825,531 | B1 | 11/2004 | Mallikarjunaswamy |
| 6,861,711 | B2 | 3/2005 | Mallikarjunaswamy |
| 6,864,537 | B1 | 3/2005 | Mallikarjunaswamy |
| 6,888,710 | B2 | 5/2005 | Mallikarjunaswamy et al. |
| 7,064,407 | B1 | 6/2006 | Mallikarjunaswamy |
| 7,087,973 | B2 | 8/2006 | Mallikarjunaswamy et al. |
| 7,145,206 | B2 | 12/2006 | Mallikarjunaswamy |

(Continued)

*Primary Examiner* — Benjamin Sandvik
*Assistant Examiner* — Leslie Pilar Cruz
(74) *Attorney, Agent, or Firm* — Kenneth C. Brooks

(57) ABSTRACT

The present invention features a field effect transistor forming on a semiconductor substrate having formed thereon gate, source and drain regions, with said gate region having a lateral gate channel. A plurality of spaced-apart trenches each having an electrically conductive plug formed therein in electrical communication with said gate, source and drain regions, with said trenches extend from a back surface of said semiconductor substrate to a controlled depth. A trench contact shorts the source region and a body region. A source contact is in electrical communication with said source region and a drain contact in electrical communication with said drain region, with said source and drain contacts being disposed on opposite sides of said gate channel.

23 Claims, 12 Drawing Sheets

(56) References Cited

U.S. PATENT DOCUMENTS

| | | |
|---|---|---|
| 7,145,211 B2 | 12/2006 | Mallikarjunaswamy et al. |
| 7,485,549 B2 | 2/2009 | Mallikarjunaswamy et al. |
| 7,608,907 B2 | 10/2009 | Mallikarjunaswamy |
| 7,843,019 B2 | 11/2010 | Mallikarjunaswamy et al. |
| 7,851,314 B2 | 12/2010 | Mallikarjunaswamy et al. |
| 7,919,817 B2 | 4/2011 | Mallikarjunaswamy |
| 8,143,654 B1 * | 3/2012 | Saunier ........................ 257/275 |
| 2004/0227194 A1 | 11/2004 | Mallikarjunaswamy |
| 2005/0036251 A1 | 2/2005 | Mallikarjunaswamy et al. |
| 2005/0139958 A1 | 6/2005 | Mallikarjunaswamy |
| 2005/0167753 A1 | 8/2005 | Mallikarjunaswamy et al. |
| 2005/0275027 A1 | 12/2005 | Mallikarjunaswamy |
| 2007/0020863 A1 * | 1/2007 | Ma et al. ........................ 438/297 |
| 2009/0115018 A1 | 5/2009 | Mallikarjunaswamy |
| 2009/0268361 A1 | 10/2009 | Mallikarjunaswamy |
| 2011/0049623 A1 | 3/2011 | Mallikarjunaswamy et al. |

* cited by examiner

THROUGH SILICON VIA PROCESSING TECHNIQUES FOR LATERAL DOUBLE-DIFFUSED MOSFETS

BACKGROUND OF THE INVENTION

The invention relates to high voltage semiconductor devices and the manufacturing process thereof and, in particular, to a lateral double-diffused metal oxide semiconductor (LDMOS) transistor, particularly to vertical discrete LDMOS with source on the device backside. The device is considered 'vertical' because the source is on the bottom and the drain is on the top (or vice-versa). The term 'lateral' refers to the planar gate of the device.

Lateral double-diffused metal-oxide-semiconductor (LDMOS) transistors are commonly used in high-voltage applications (e.g. 20 to 500 volts or higher) because of their high breakdown voltage characteristics and compatibility with complementary metal-oxide-semiconductor (CMOS) technology for low voltage devices. In general, an LDMOS transistor includes a planar polysilicon gate, an N+ source region formed in a P-type body region, and an N+ drain region. The N+ drain region is separated from the channel formed in the body region under the polysilicon gate by an N drain drift region. It is well known that by increasing the length of the N drift region, the breakdown voltage of the LDMOS transistor can be accordingly increased.

Typically LDMOS transistors are used in high frequency applications, such as radio frequency and/or microwave power amplifiers. They are often employed in power amplifiers for base-stations where the requirement is for high output power with a corresponding drain to source breakdown voltage usually above 60 volts. It is desired, therefore, to provide LDMOS transistors that are capable of providing high frequency operation while maintaining the high voltage operation of the same.

It is desired in some cases to make the LDMOS transistor a vertical device. It can be especially advantageous to route the source to the bottom of the die for better packaging options, e.g. for lowering inductance on the source. However it is difficult to route the source of an LDMOS transistor to the substrate without a large increase in resistance.

Accordingly, there is a need to provide improved LDMOS transistors.

SUMMARY OF THE INVENTION

The present invention features a field effect transistor formed on a semiconductor substrate having formed thereon gate, source and drain regions, with the gate region having a lateral gate channel. A plurality of spaced-apart trenches or through semiconductor vias (TSV) each having an electrically conductive plug formed therein in electrical communication with the gate, source and drain regions are configured to lower the resistance of the bottom source. A contact trench is formed adjacent to the source region and shorts the source region and a body region. A source contact is in electrical communication with the source region; and a drain contact in electrical communication with the drain region, with the source and drain contacts being disposed on opposite sides of the lateral gate channel.

DETAILED DESCRIPTION OF THE INVENTION

Figure 1:
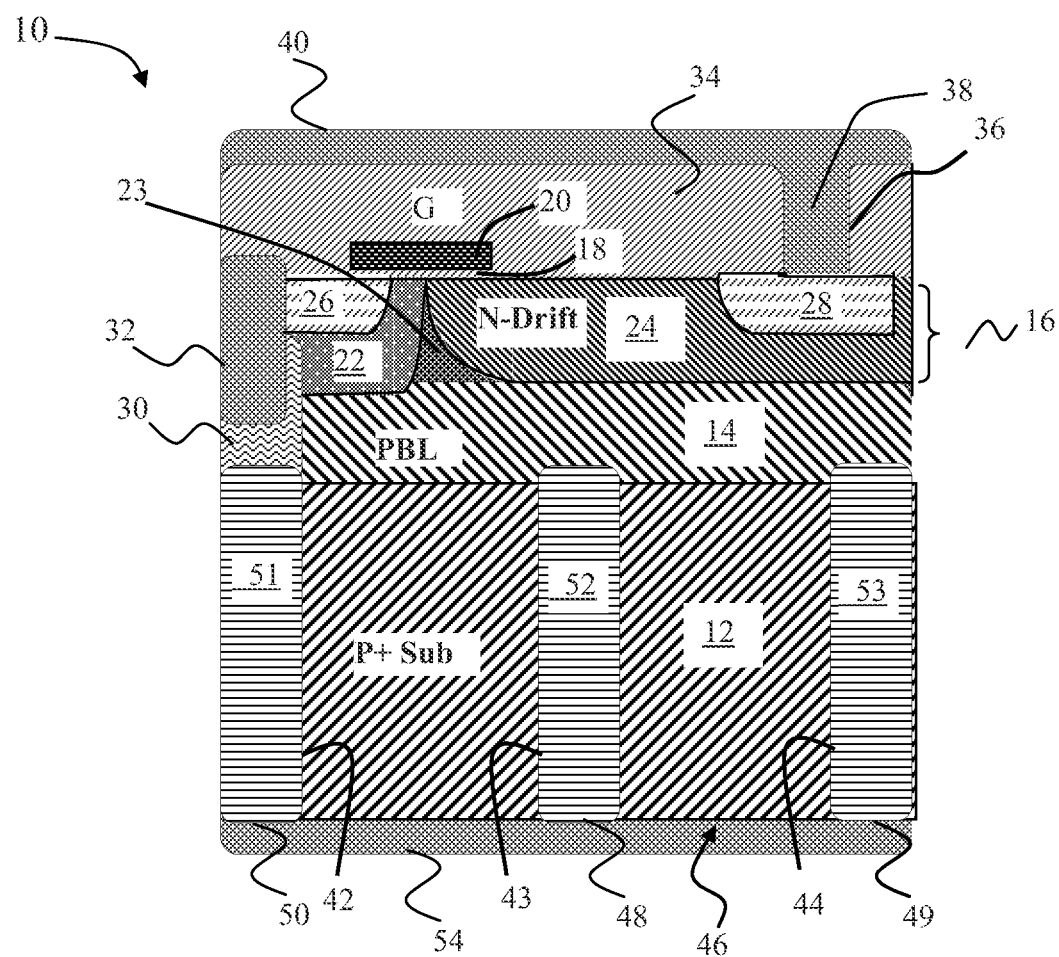
FIG. 1 is cross-sectional view of a transistor in accordance with one embodiment of the present invention.
Figure 2:
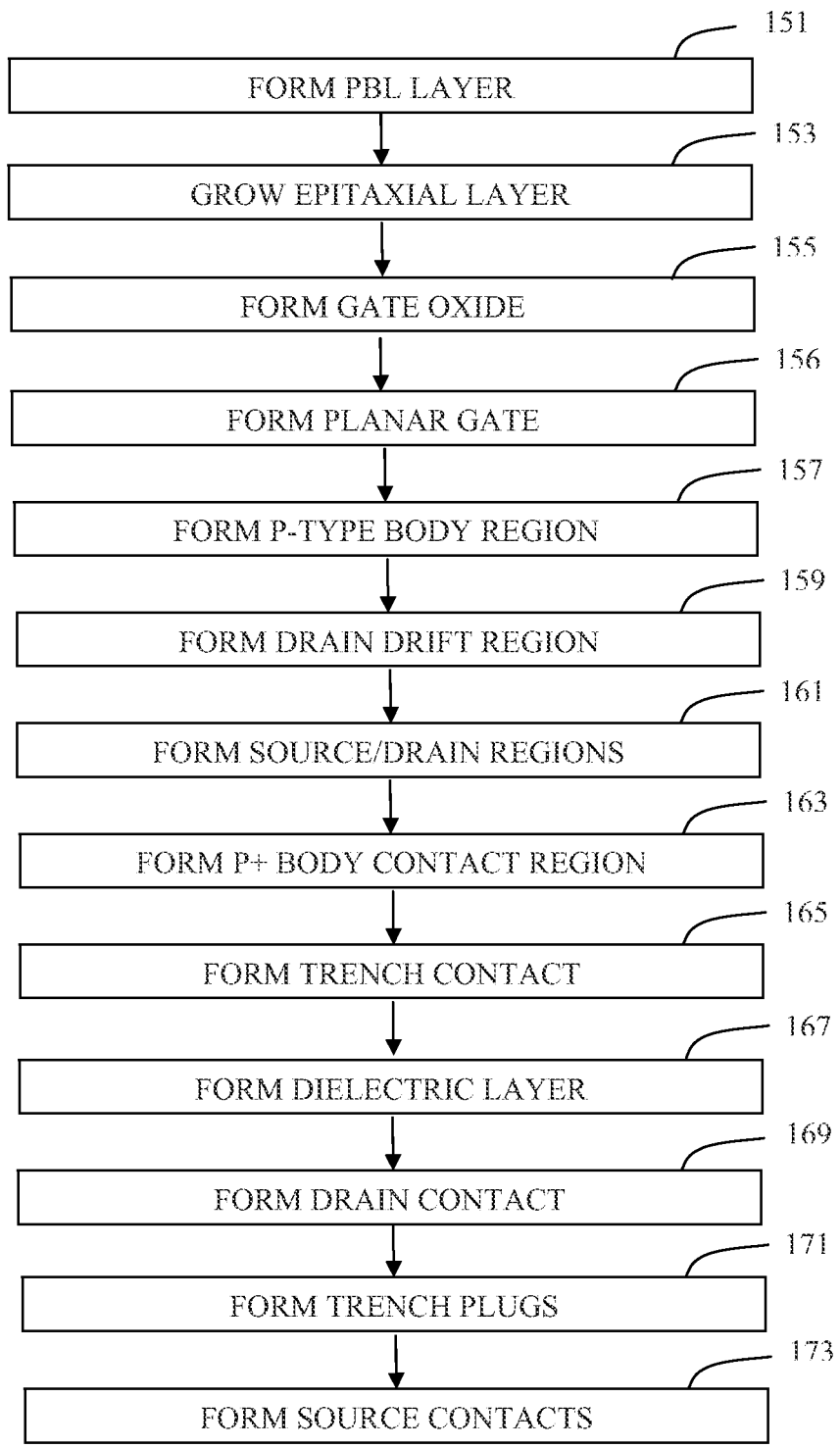
FIG. 2 is a flow diagram showing a method of fabricating the transistor shown in FIG. 1.

Referring to both FIGS. 1 and 2, LDMOS 10 is formed on a P-type substrate 12 with an epitaxial layer 16 is formed thereon, A P-type buried layer (PBL) 14 is formed at the junction of the P-type substrate 12 and the epitaxial layer 16 as indicated at step 151. The epitaxial layer 16 is grown on top of the PBL layer as indicated at step 153. The epitaxial layer may be N-type or P-type. The active regions of transistor 10 are formed in the epitaxial layer 16. PBL 14 may be formed by standard buried layer implantation processes, or alternatively, may be formed using a step epitaxial process. That is, a heavily doped P-type epitaxial layer may be grown on top of substrate 12 to serve as PBL 14. Alternatively, the PBL 14 may be formed by deep implantation. Epitaxial layer 16 may be grown on top of the PBL 14. A thickness of PBL layer 14 may be about couple of microns thick when a thickness of epitaxial layer 16 is in a range of few microns to 10 microns. Specifically, epitaxial layer 16 is in the range of few microns to 5 microns for a LDMOS with a drain breakdown voltage BVdss of about 20V to 60V.

A gate oxide layer 18 is formed atop of epitaxial layer 16 as indicated at step 155, and a planar gate 20 is formed upon the gate oxide layer using standard deposition and patterning techniques as indicated at step 156. Typically gate oxide layer is formed from silicon-oxide and gate 20 is formed from polysilicon. The gate 20, however, may be formed from electrically conductive materials other than polysilicon. A P-type body region 22 is formed in epitaxial layer 16 using standard processes an as to extend from PBL 14 to gate oxide 18 and form an arcuate region that is adjacent to and spaced-apart from an N-drift region 24, as indicated at step 157, which is discussed more fully below. In the present embodiment P-type body region 22 may be formed through a P-type implant self-aligned to the edge of polysilicon gate 20 followed by a thermal anneal. Following formation of P-type body region 22, drain drift region 24 is formed in epitaxial layer 16 using standard processes indicated at step 159. Drain drift region 24 is formed using implantation of the desired dopants, in the present example N-type dopants, followed by thermal anneal. Alternatively, the P-type body region 22 and the drain drift region 24 may be formed before formation of gate oxide layer 18 and/or polysilicon gate 20. With this configuration, a region 23 of epitaxial layer 16 may remain substantially free of the implanted dopants.

Source and drain regions 26 and 28 are formed using standard techniques, such as by implantation of the desired dopants followed by thermal driving of the same to provide source region 26 and drain region 28 with a desired conductivity as indicated at step 161. The presence of polysilicon gate 20 may allow for a self-aligned implantation process for source region 26.

A trench 32 is formed employing standard etching techniques and is filled with an electrically conductive material such as metal, to provide a trench contact 32. Specifically, a thin barrier metal layer of Ti—TiN is first form in the bottom and sidewall of trench 32, which may be done by sputtering, followed by a chemical vapor deposition (CVD) of Tungsten (W) and then a sputtering of Ti—Ti—AlCu. Trench contact 32 shorts the source region 26 and body region 22 together, as well as to the PBL 14, A P+ body contact region 30 may be included in transistor to provide good ohmic contact to P body region 22 and to PBL 14. To that end, angled ion implantation of P-type dopants may be performed before filling in the trench 32 followed by a thermal anneal to provide a desired doping concentration of P+ region 30 as indicated at steps 163 and 165. The N+ source region 26 is heavily doped enough that the P+ implant body contact would not significantly counterdope the source region.

A dielectric layer 34 is formed to cover polysilicon gate 20, gate oxide layer 18 and trench contact 32 indicated at step 167. The dielectric layer 34 may include Boro Phospho Silicate Glass (BPSG), doped oxide or oxide formed by chemical vapor deposition and has a thickness of about one micron. A contact opening 36 is formed in the dielectric layer 34 to expose drain region 28 by etching the dielectric layer 34. Contact opening 36 is filled with electrically conductive material, such as tungsten, copper, and the like to form a conductive plug 38. Similar to trench 32, a thin barrier metal layer of Ti—TiN is first form in the bottom and sidewall of contact opening 36, which may be done by sputtering, followed by a chemical vapor deposition (CND) of Tungsten (W) and then a sputtering of Ti—Ti—AlCu. After formation of plug 38 deposition of electrically conductive material, e.g. metal, continues to form drain contact 40 indicated at step 169.

A plurality of deep trenches or TSAI 42, 43 and 44 are formed from a back side 46 of substrate 12 disposed opposite to drain contact 40 as indicated at step 171. Trenches 42, 43 and 44 are formed using standard etching techniques by etching from side 46 of substrate 12 such that trenches 43 and 44 extend from orifices, 48 and 49, respectively, located in side 46 and terminate PBL layer 14; and trench 42 extends from orifice 50, terminating in P+ contact 30 or PBL 14, or directly to trench contact 32. Alternatively, trenched 42, 43 and 44 can be formed by TSV laser drilling from the backside 46, followed by trench clean or isotropic dry etch. Trenches 42, 43 and 44 are filled with an electrically conductive material or TSV metal, such as tungsten, copper, and the like to form plugs 51, 52 and 53 which is connected to an electrically conductive material covering the back side 46 forming a source contact 54 as indicated at step 173. By way of example the trenches 42, 43 and 44 and their conductive fills may be formed as partial through silicon vias (TSV) (or more generally, through semiconductor vias), etched through substrate 12.

With this configuration, transistor 10 forms a gate region having a planar gate. Gate 20 defines a lateral channel in the P-body region 22 near the surface of epitaxial layer 16. Electrons flow from the N+ source region 26, through the lateral channel in the P-body region 22 in the lateral direction into the drain drift region 24. Trench contact 32 shorts the N+ source region 26 to the P-body region 22 as well as to the PBL 14. Electrons are connected between the source region 26 and the source contact 54 by a path running from the N+ source region 26, through the trench contact 32 in the vertical direction into the PBL 14 and then laterally across the PBL 14 and down through the conductive plugs 51, 52, 53 to the source contact 54. Specifically, plugs 51, 52 and 53 reduce the source resistance to increase the transistor efficiency. It is desired to minimize the spacing between adjacent plugs 51, 52 and 53 without compromising the structural integrity of transistor 10. The spacing between adjacent plugs 51, 52 and 53 is therefore, dependent upon many factors including the materials from which transistor 10 is formed, as well as the dimensions of the same. The PBL 14 may additionally provide a Reduced Surface Field (RESURF) effect with the drain drift region 24 to improve the breakdown voltage of the transistor 10.

Figure 3:
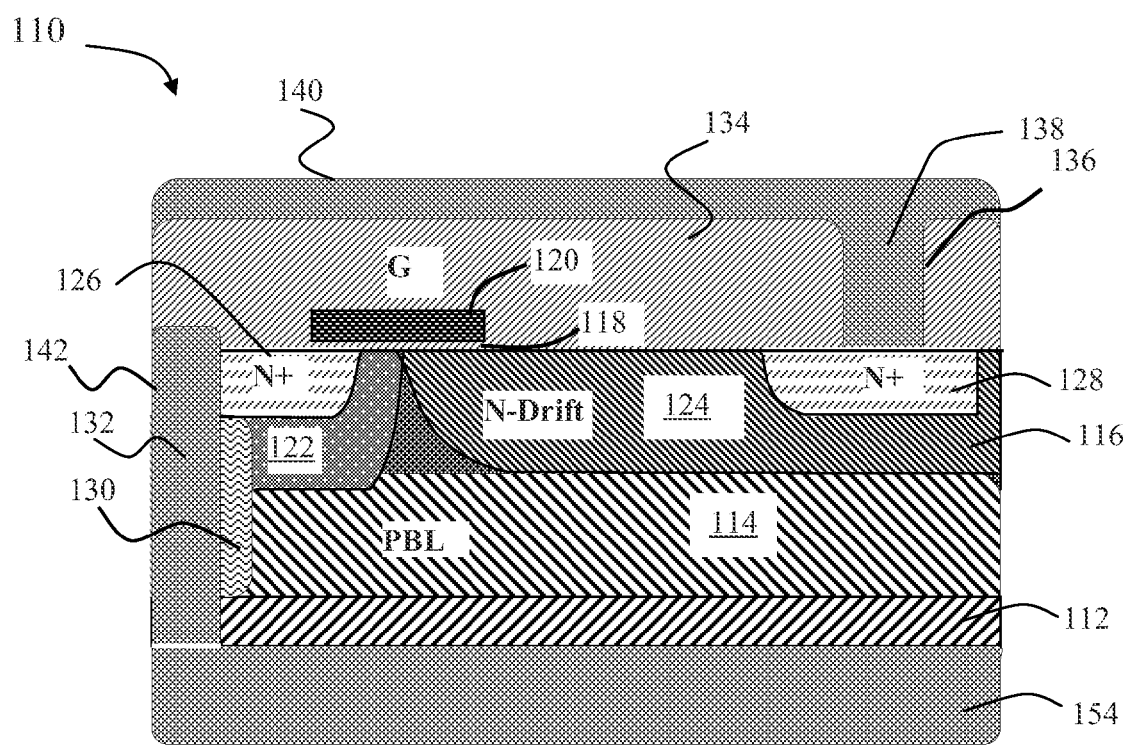
FIG. 3 is cross-sectional view of a transistor in accordance with a second embodiment of the present invention.

Referring to both FIGS. 1 and 3, a transistor 110 is shown that provides similar characteristics as transistor 10 while omitting trenches 43 and 44, as well as plugs 52 and 53. As a result, features 114, 116, 118, 120, 122, 126, 128, 130, 134, 136, 138 and 140 are identical to features 14, 16, 18, 20, 22, 26, 28, 30, 34, 36, 38 and 40 and are fabricated in the same manner.

Figure 4:
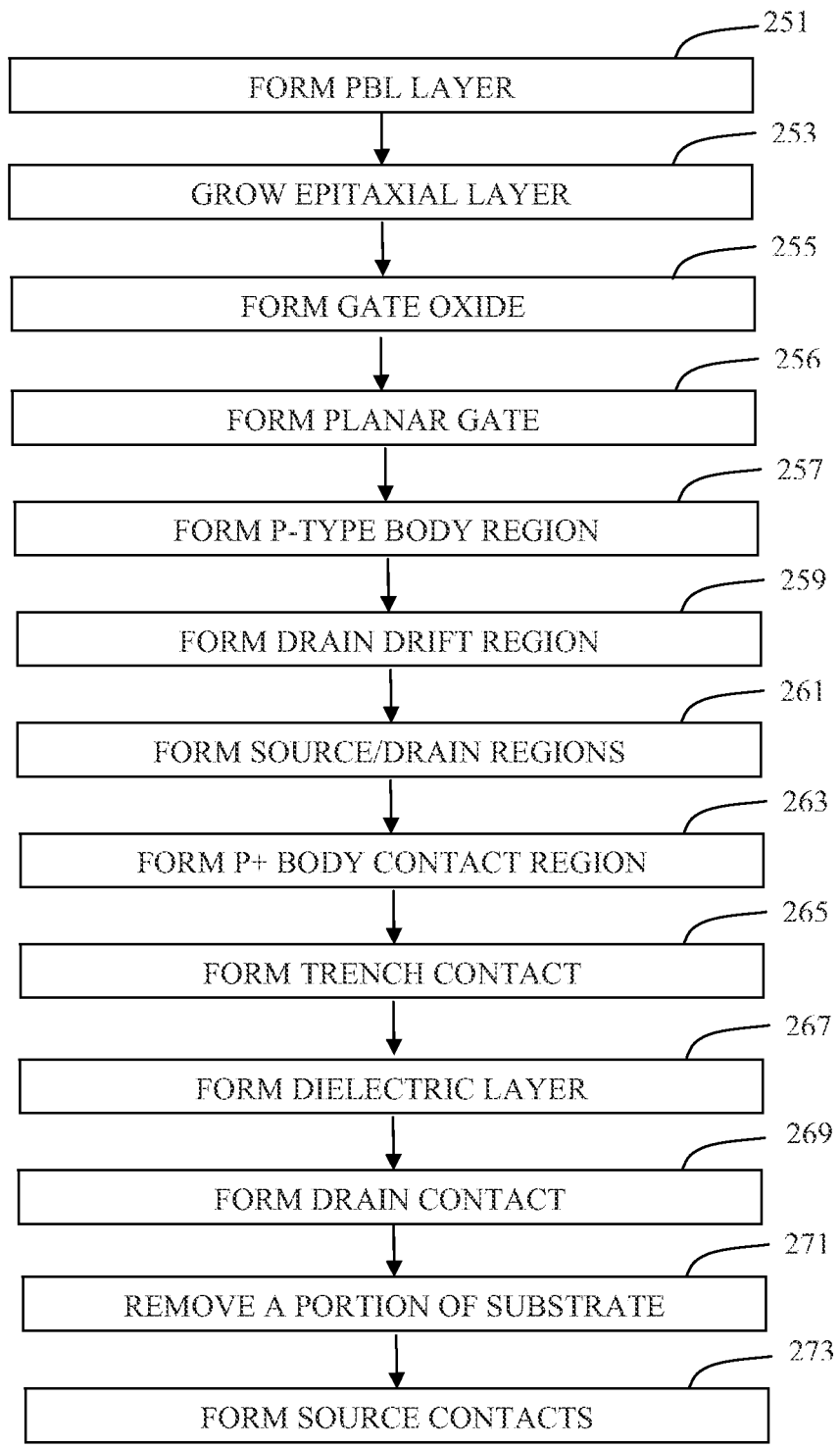
FIG. 4 is a flow diagram showing a method of fabricating the transistor shown in FIG. 3.

Referring to FIGS. 1, 3 and 4, fabrication of the transistor 110 is discussed with steps 251-263, 267 and 269 being identical to steps 151-163, 167 and 169. However, trench contact 132 of transistor 110 is formed deeper from a top surface of the epitaxial layer and extends at least partially into the substrate 112 as indicated at step 262. Furthermore, the substrate 112 is subjected to aback grinding process to remove a substantial portion from its backside so that the bottom of the trench contact 142 is exposed as indicated at step 271. After step 271, the thickness of the substrate 112 is less than 50 micron. Alternatively, following the back grinding process, trench 142 may be formed from the backside to extend completely through substrate 112 and terminate in passivation layer 134 however this may be difficult to properly align from the backside. Trench 142 is filled with electrically conductive material, such as tungsten, copper and the like, to form trench contact 132. The trench contact 132 is connected to a source contact 154, which covers the back side of the semiconductor substrate 112 as indicated at step 273.

Figure 5:
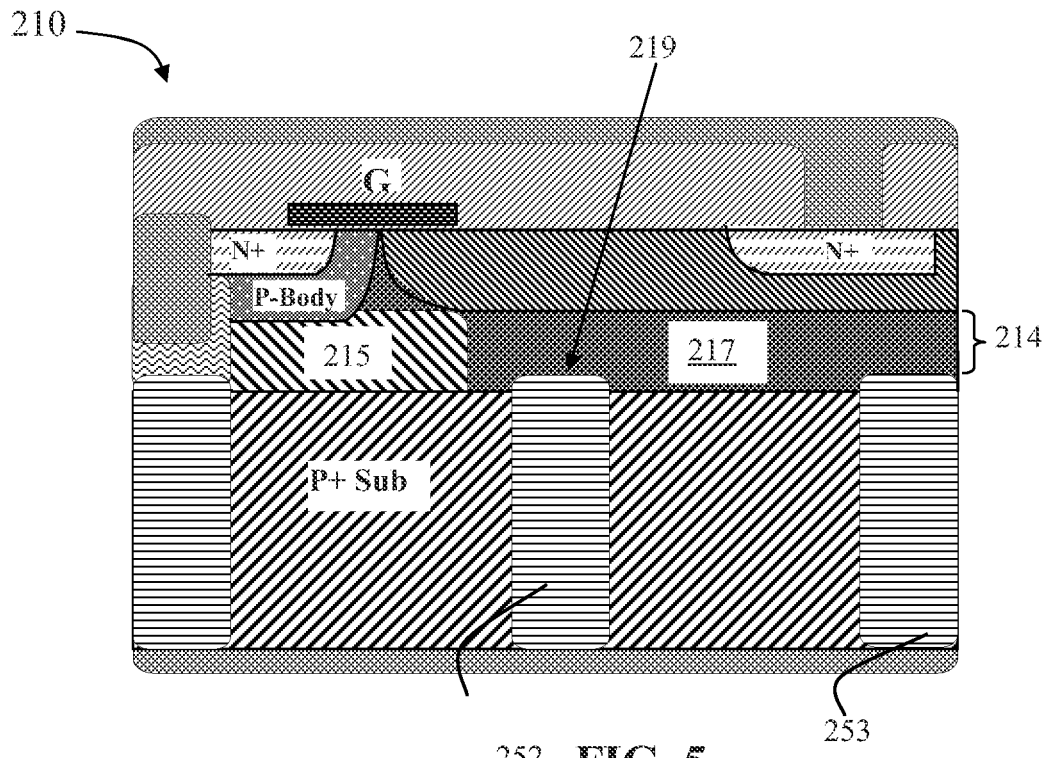
FIG. 5 is cross-sectional view of a transistor in accordance with a third embodiment of the present invention.

Referring to FIGS. 1 and 5, another embodiment of transistor 10 is shown as transistor 210. Transistor 210 is identical to transistor 10, excepting that PBL layer 14 of transistor 10 has been replaced with a layer 214 formed on substrate 212 that is bifurcated into two different regions 215 and 217 each having dopants of different conductivity types. Region 215 is identical in dopant concentration and conductivity type to PBL layer 14 of transistor 10. However, region 217 is lightly doped with N-type dopants or may be the N-type epitaxial layer 216 itself. The dopant concentration of region 217 is such as to establish a Schottky contact 219 where the lightly doped N-type region 217 contacts the metal plugs 252 and 253. This structure improves the reverse recovery of reverse conducting diode of the transistor 210, when compared with the normal P—N junction body diode of transistor 10.

Figure 5A:
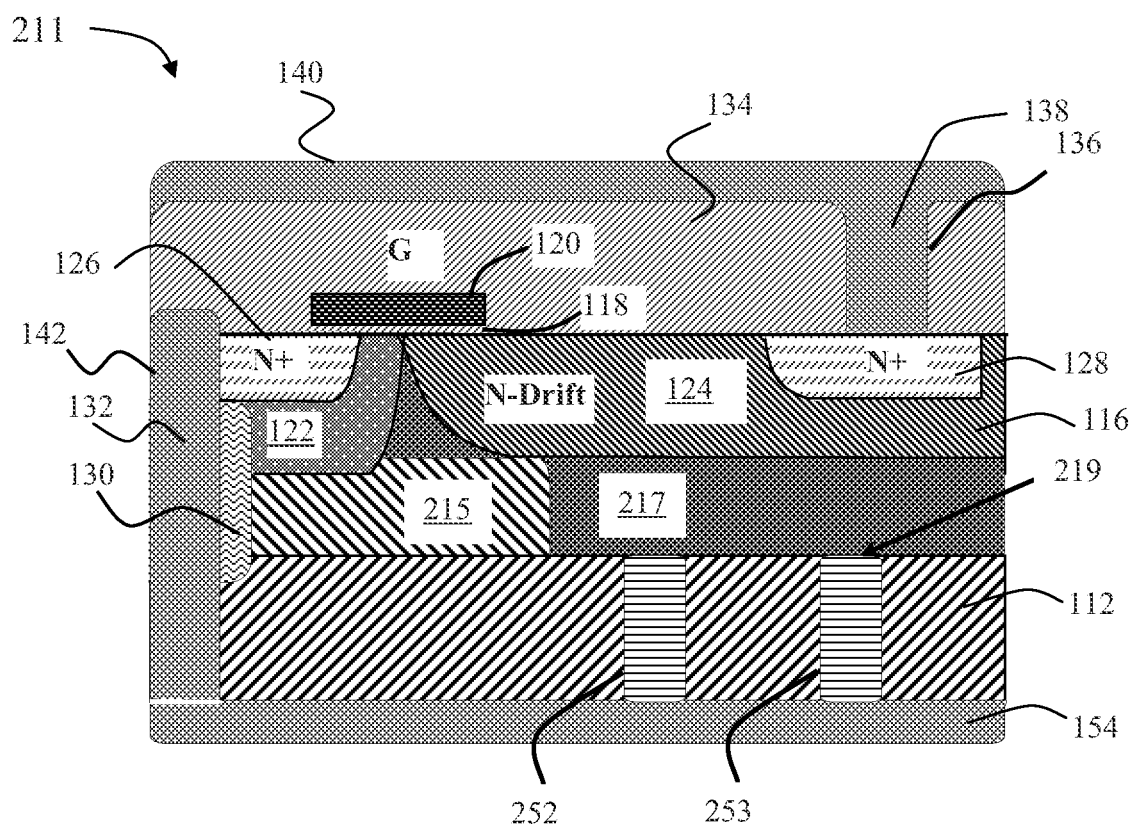
FIGS. 5A-5C are cross-sectional views of alternative transistors accordance with the third embodiment of the present invention.

Referring to FIGS. 3, 5 and 5A, an alternative configuration of transistor 110 is shown as transistor 211, which includes integrated Schottky contacts 219 similar to that of FIG. 5.

Transistor 211 is identical to transistor 110, excepting that PBL layer 114 of transistor 110 has been replaced with a layer that is bifurcated into two different regions 215 and 217 each having dopants of different conductivity types. Region 215 is identical dopant concentration and conductivity type to PBL layer 114 of transistor 110. However, region 217 is lightly doped N-type or can be the N-type epitaxial layer 116 itself. The dopant concentration of region 217 is such as to establish a Schottky contact 219 where the lightly doped N-type region 217 contacts the metal plugs 252 and 253.

Figure 5B:
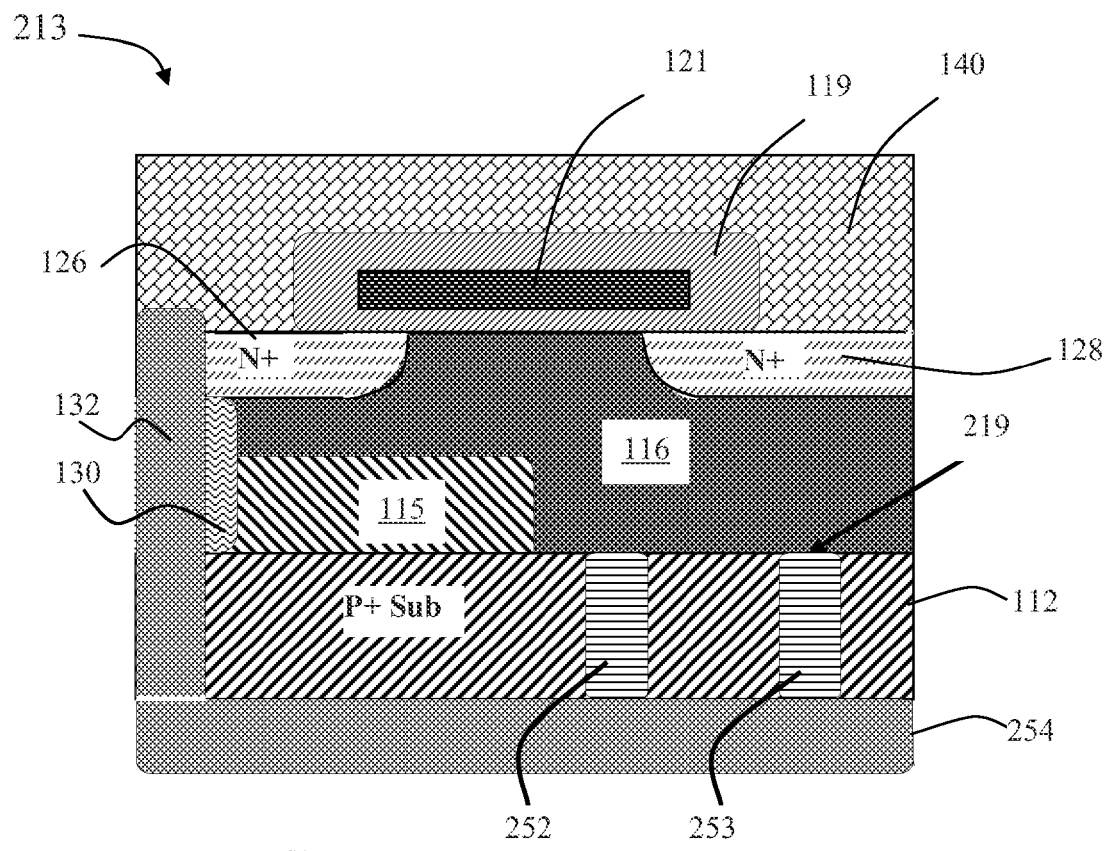

Referring to FIGS. 3, 5A and 5B, an alternative configuration of transistor 210 is shown as transistor 213, which is a CMOS with integrated Schottky contacts 219 similar to that of FIG. 5. Transistor 213 is similar to transistor 211, excepting that transistor 213 is a N+ drain NMOS. As shown in FIG. 5B, the transistor 213 includes a N+ source 126, a N+ drain 128 formed in a P well 116 with a planar gate 121 formed on top of the P 116 and insulated with a gate oxide 119.

Figure 5C:
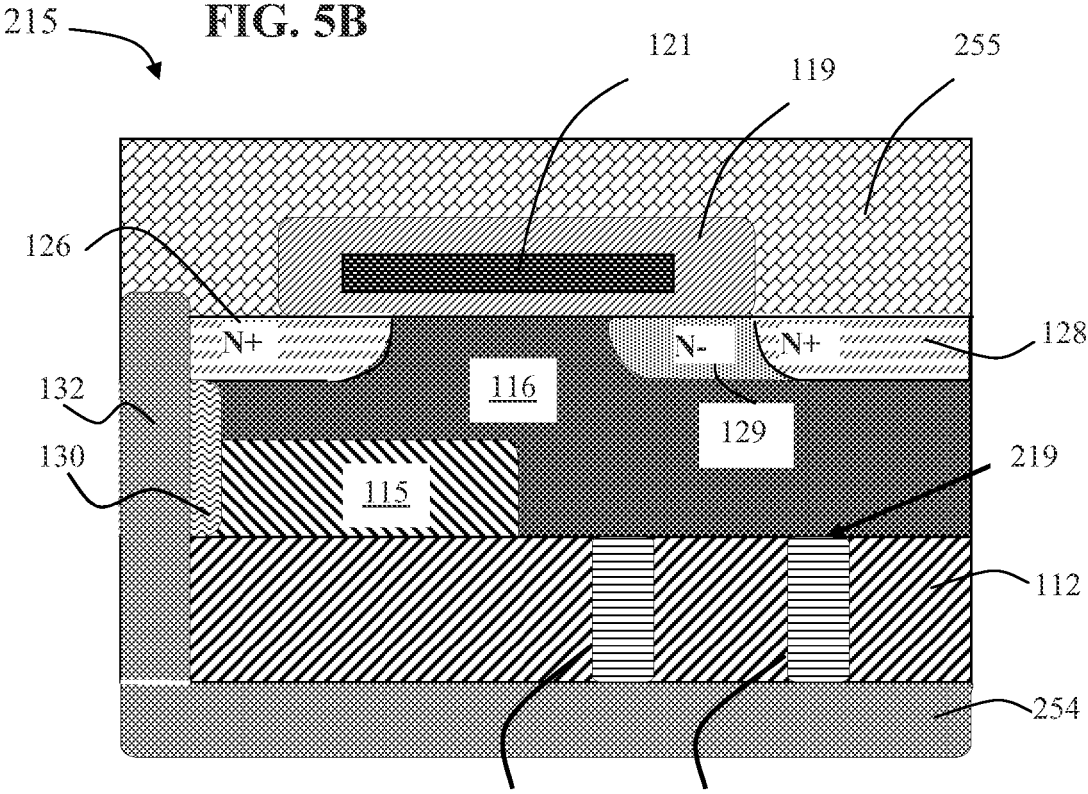

Referring to FIGS. 3, 5A and 5C, an alternative configuration of transistor 210 is shown as transistor 215, which is a LDD NMOS with integrated Schottky contacts 219 similar to that of FIG. 5. Transistor 215 is similar to transistor 211, excepting that transistor 213 is a lightly doped drain (LDD) NMOS. As shown in FIG. 5B, the transistor 213 includes a N+ source 126, a N+ drain 128 and a lightly doped N drift drain 129 formed in a P well 116 with a planar gate 121 formed on top of the P well 116 and insulated with a gate oxide 119.

Figure 6:
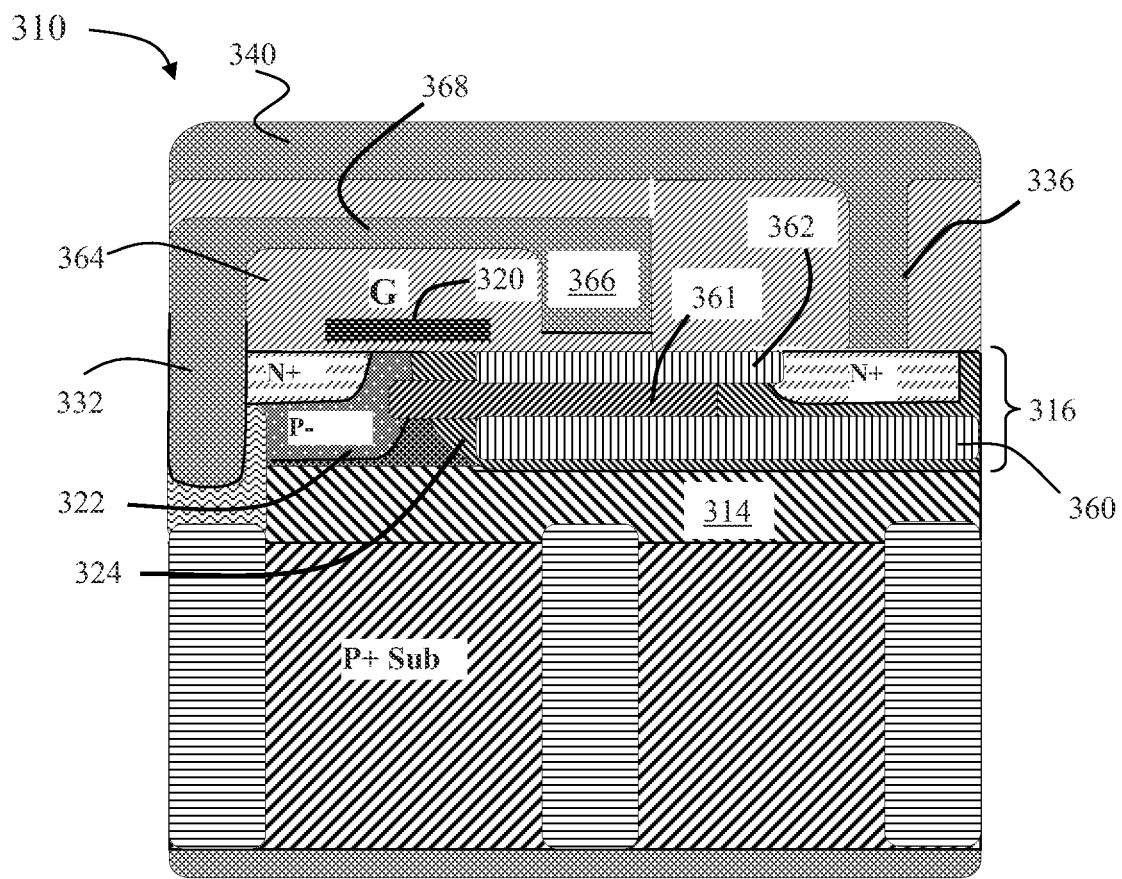
FIG. 6 is cross-sectional view of a transistor in accordance with a fourth embodiment of the present invention.

Referring to both FIGS. 1 and 6, another embodiment of transistor 10 is shown as transistor 310. As a result, features 336 and 340 are substantially identical to features 36 and 40 and are fabricated in the same manner. Transistor 310 is substantially identical to transistor 10, excepting that the drift region 24 of epitaxial layer 16 is now provided with superjunction structures. To that end, epitaxial layer 316 of transistor 310 includes a plurality of alternating N-type and P-type doped regions 360, 361 and 362, respectively. Regions 360 and 362 are associated with a common conductivity type, and region 361 is associated with an opposite conductivity type. In one embodiment, regions 360 and 362 are associated with an N-type conductivity type and are connected to the drain voltage, and region 361 is associated with a P-type conductivity type and connected to the source voltage via the P-body region 322. It should be understood, however, that regions 360 and 362 maybe associated with a P-type conductivity type, and region 361 may be associated with an N-type conductivity type. Regions 360-362 may be associated with the desired conductivity type by use of multiple energy implants of desired dopants, which is well known in the art. Furthermore, in another embodiment, the regions 360 and 362 may be formed self-aligned to the gate 320. Region 361 extending from P-body region 322 can be realized through an angle implant and subsequent thermal anneal that drive dopants to a desired location. When the transistor is off, the drain and source are at different voltages, thus reverse biasing the super-junction regions 360 and 362 with super-junction region 361. The regions 360-362 deplete and are able to affect a large breakdown voltage for the device. When the transistor is on, the gate activates a channel connecting the source to the drain, such that the super-junction regions 360-362 are approximately at the same voltage and do not deplete.

Optionally, a gate-drain metal shield may be formed to shield the gate 320 from the drain electrode. The contact trench 332 is connected to a gate-drain shield portion 366 with an inter-level conductive layer 368 extending over and in superimposition with gate 320. The gate-drain shield portion 366 comes close to the drain drift region 324, but is separated therefrom with passivation material. A passivation layer 364 insulates the gate-drain metal shield from the gate electrode 320. The PBL 314 provides a single RESURF effect with the drain drift region 324 to improve the breakdown voltage of the transistor 310.

Figure 7:
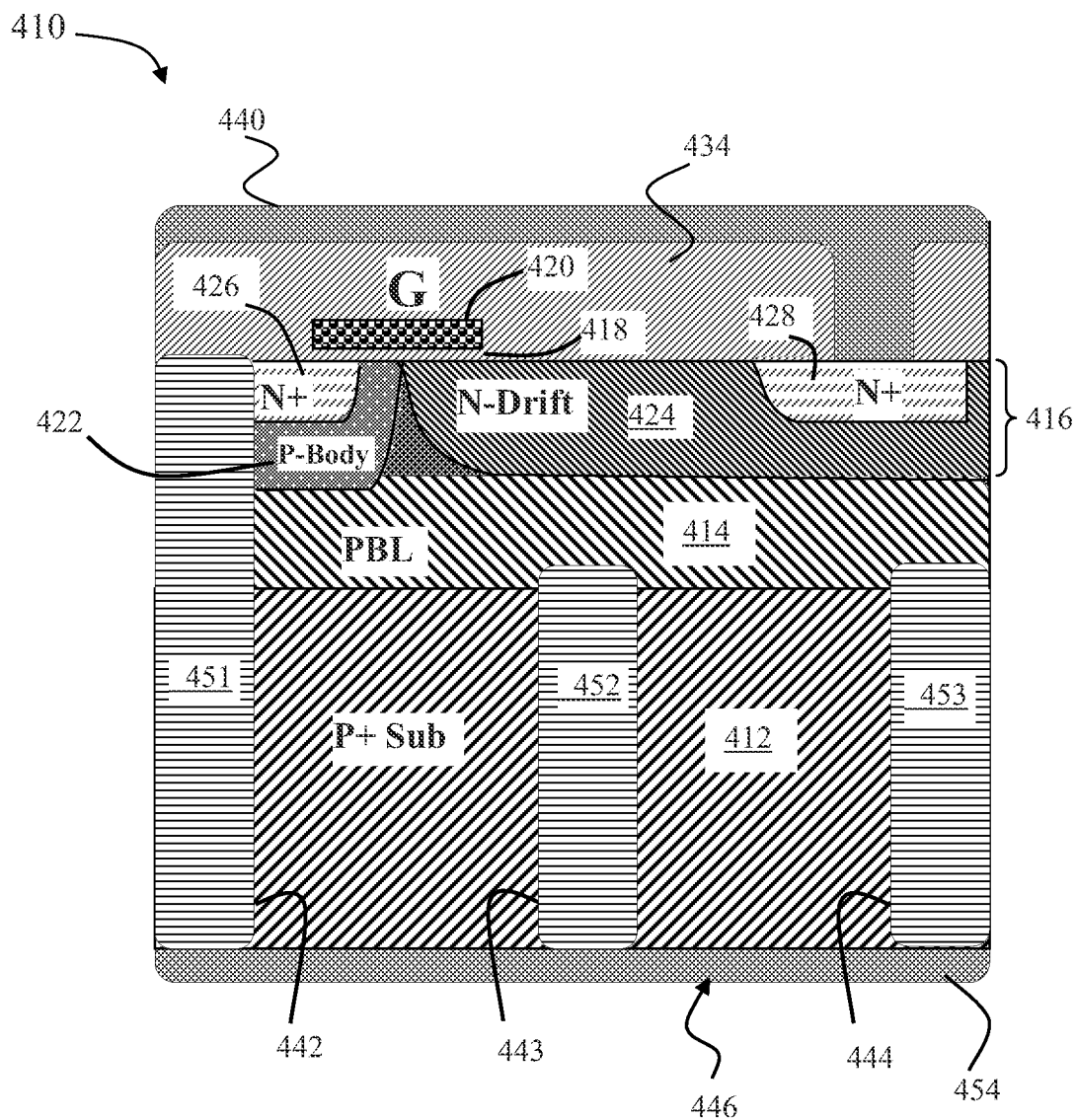
FIG. 7 is cross-sectional view of a transistor in accordance with a fifth embodiment of the present invention.

Referring to FIGS. 1 and 7, in accordance with another embodiment, transistor 410 is identical to transistor 10, excepting that trench 442, which corresponds to trench 42, is formed to extend all the way from source contact 454 to the source region 426. Specifically, features 414, 416, 418, 420, 422, 424, 426, 428, 434, 436, 440, 443, 444, 446, 452, 453 and 454 are identical to features 14, 16, 18, 20, 22, 24, 26, 28, 34, 36, 40, 43, 44, 46, 52, 53 and 54 and are fabricated in the same manner. Thus deep trenches and plugs with two different depths are formed in the transistor substrate. Some plugs, such as 452 and 453 only extend partially through the semiconductor material, i.e., from the bottom surface 446 to the PBL 414. Other plugs, like 451, may extend all the way through, from the bottom surface 446 to the source 426 and the passivation 434 at the top of the die.

The fabrication of transistor 410 is similar to the fabrication of transistor 10 as described above in FIG. 2. The only difference is that at the step of forming the trench plugs, i.e., step 171, trench 442 is properly aligned to the contact source and body regions and extends all the way to the passivation layer, while trenches 443 and 444 only extend partially through the semiconductor material of the substrate 412 to the PBL 414.

Figure 8:
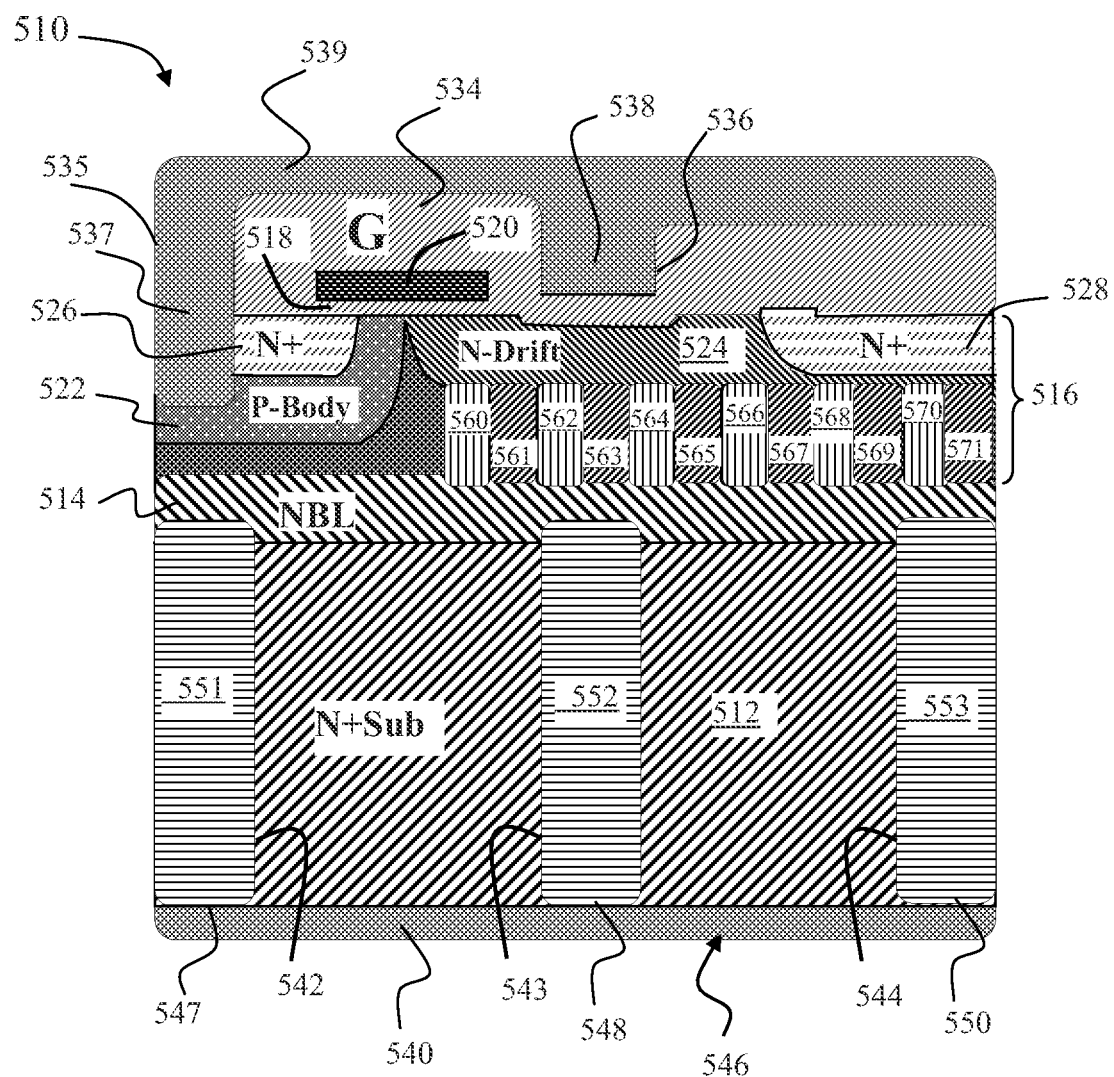
FIG. 8 is cross-sectional view of a transistor in accordance with a sixth embodiment of the present invention.

Referring to both FIGS. 1 and 8, in yet another embodiment, transistor 510, which is a LDMOS with bottom drain, includes the benefits of a plurality of trenches 542-544 formed into substrate 512 and filled with electrically conductive material or TSV metal to form plugs that are connected with (and optionally integrally formed with) a bottom drain contact 540. Transistor 510 includes an N-type substrate 512 with an N-type buried layer (NBL) 514 formed thereon. An epitaxial layer 516 is formed on the NBL 514 in which the active regions of transistor 510 are formed. The epitaxial layer may be N-type or P-type. NBL 514 may be formed by standard buried layer implantation processes, or alternatively, may be formed using a step epitaxial process; that is, a layer may be grown on top of substrate 512 as NBL 514. Epitaxial layer 516 may be grown on top of the NBL 514.

A gate oxide layer 518 is formed atop of epitaxial layer 516 and a polysilicon gate 520 is formed upon the gate oxide layer using standard deposition and patterning techniques. The gate 520, however, may be formed from other electrically conductive materials besides polysilicon. A P-type body region 522 is formed in epitaxial layer 516 using standard processes. In the present embodiment P-type body region 522 is formed through a P-type implant self-aligned to the edge of polysilicon gate 520. In other embodiments, P-type body region 522 may be formed using a low voltage P-well (LVPW) in the fabrication process. As a result, P-type body region 522 may be formed before formation of gate oxide layer 518 and/or polysilicon gate 520. Following formation of P-type body region 522, an N-type drain drift region 524 is formed in epitaxial layer 516 using standard processes. Drain drift region 524 is formed using implantation of the desired dopants, e.g., N-type dopants, followed by a thermal anneal.

Source and drain regions 526 and 528 are formed using standard techniques, such as by implantation of the desired dopants followed by a thermal anneal of the same to provide source region 526 and drain region 528 with a desired conductivity type and doping concentration. The presence of polysilicon gate 520 allows for a self-aligned implantation process for source region 526.

An electrically insulative passivation layer 534 is formed to cover polysilicon gate 520, gate oxide layer 518. First and second trenches 535 and 536 are formed in passivation layer 534. Trench 535 exposes a portion of P-body 522 and the source region 526. Trench 536 comes close to drain drift region 524, but is separated therefrom with passivation material. Trenches 535 and 536 are filled with electrically conductive material, such as tungsten, copper, gold and the like to form conductive plugs 537 and 538, respectively, and then covered with source contact 539. The conductive plug 538 provides a gate-drain metal shield from the gate electrode 520. Alternatively, the material of source contact 539 may also fill in the trenches 535 and 536 without separate conductive plug material.

A plurality of deep trenches 542, 543 and 544 are formed on a side 546 of substrate 512 disposed opposite to source contact 539. Trenches are formed using standard etching techniques or laser drilling, as discussed above with respect to formation of trenches 42, 43 and 44. As shown trenches 542, 543 and 544 extend from orifices 547, 548 and 550, respectively, located from side 546 of the substrate 512 and terminate in NBL layer 514. Trenches 542, 543 and 544 are filled with an electrically conductive material or TVS metal, such as tungsten, copper, and the like, to form plugs 551, 552 and 553, which are covered with an electrically conductive material to form drain contact 540.

A super-junction is formed into epitaxial layer 516 including a plurality of alternating N-type and P-type doped regions 560-571. Each of regions 560-571 extends from NBL, 514 toward and terminates proximate to N-drift region 524 and N drain region 528. The alternating N-type and P-type doped regions 560-571 can be cylindrical columns and is connected to the P-body region in a third dimension when the N and P columns are stripped. The super-junction is configured to spread out the electric field from P-type body region or reduce surface electric field.

Figure 9:
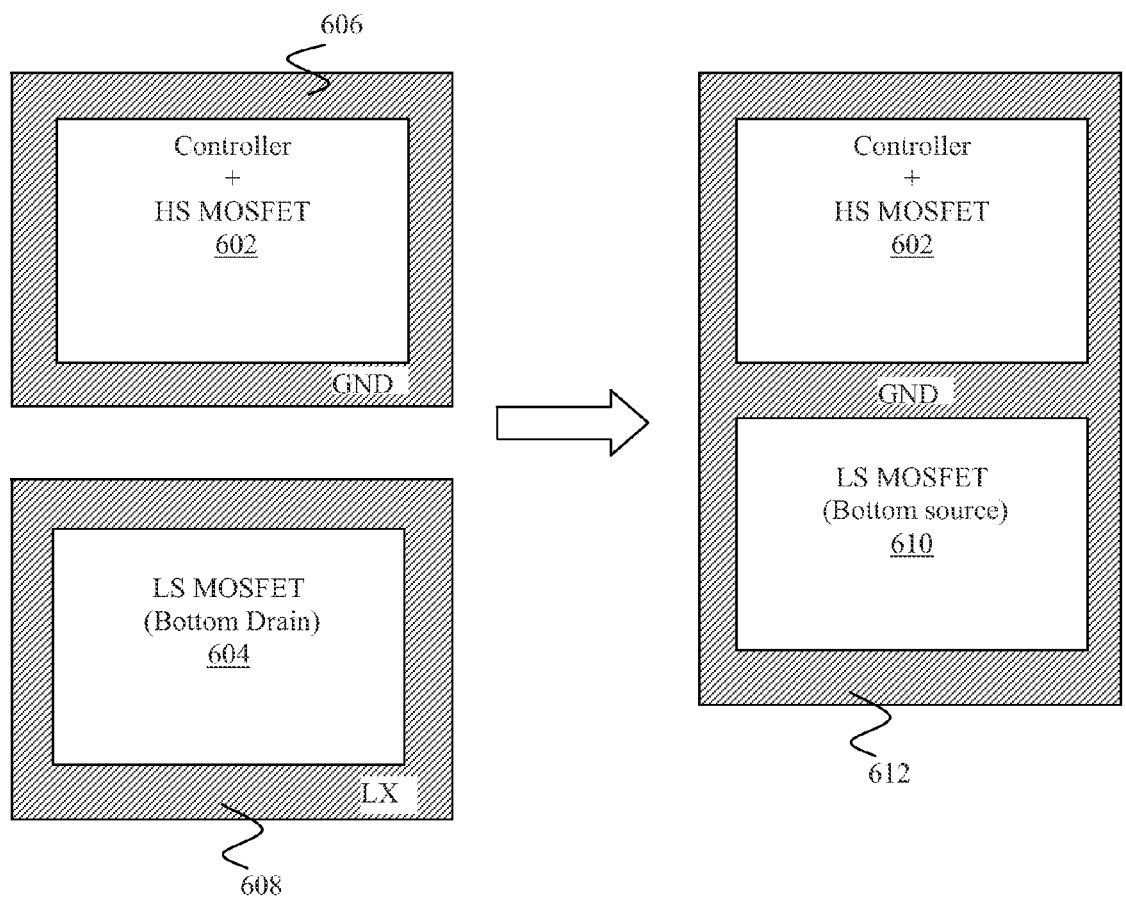
FIG. 9 is a top view illustrating a single die and dual die pad converters using LDMOS with the bottom source of the present invention.

FIG. 9 is a top view illustrating a conventional dual die pad converter and a single die pad converter using the bottom source MOSFET of the present invention. Conventionally, the standard high-side (HS) and low-side (LS) vertical MOSFETs, which include bottom drain, are built on two separate die pads within one package. As shown in FIG. 9, a controller and an integrated HS MOSFET 602 are electrically and physically connected to a die pad 606 and a bottom drain LSMOSFET 604 is electrically and physically connected to a die pad 608. In power converter package, the HS source and the LS drain are typically connected to each other to form a switch and the LS source is grounded, which may be accomplished with additional bond wires (not shown). The additional bond wires add parasitic inductance and the dual die pads 606 and 608 require more space in the converter package. By using the bottom source LS MOSFET 610 of the present invention, the controller with the integrated HS MOSFET 602 and the bottom source LS MOSFET 610 can be mounted in a single die pad 612.

Figure 10:
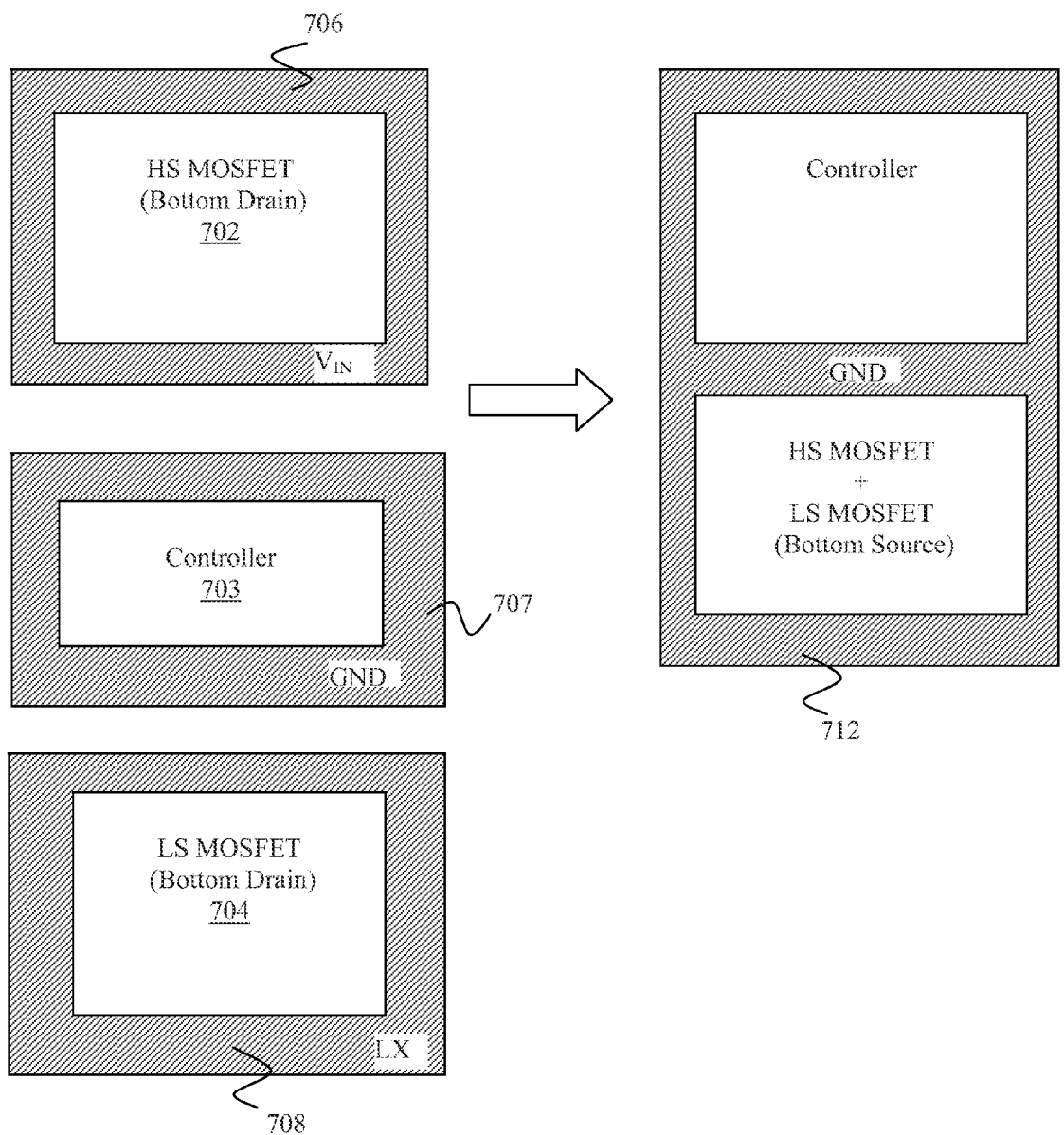
FIG. 10 is a top view illustrating an alternative single die pads and dual die pad converters using LDMOS with the bottom source of the present invention.

Alternatively, FIG. 10 is a top view illustrating another single die pad converter using the bottom source MOSFET of the present invention. As shown in FIG. 10, a bottom drain HS NMOSFET 702 is electrically and physically connected to a die pad 706, a controller 703 is electrically and physically connected to a die pad 707 and a bottom drain LS MOSFET 704 are electrically and physically connected to a die pad 708. By using the bottom source LS MOSFET of the present invention, the controller, the LS MOSFET and the HS MOSFET can be mounted in a single die pad 712.

Figure 11A:
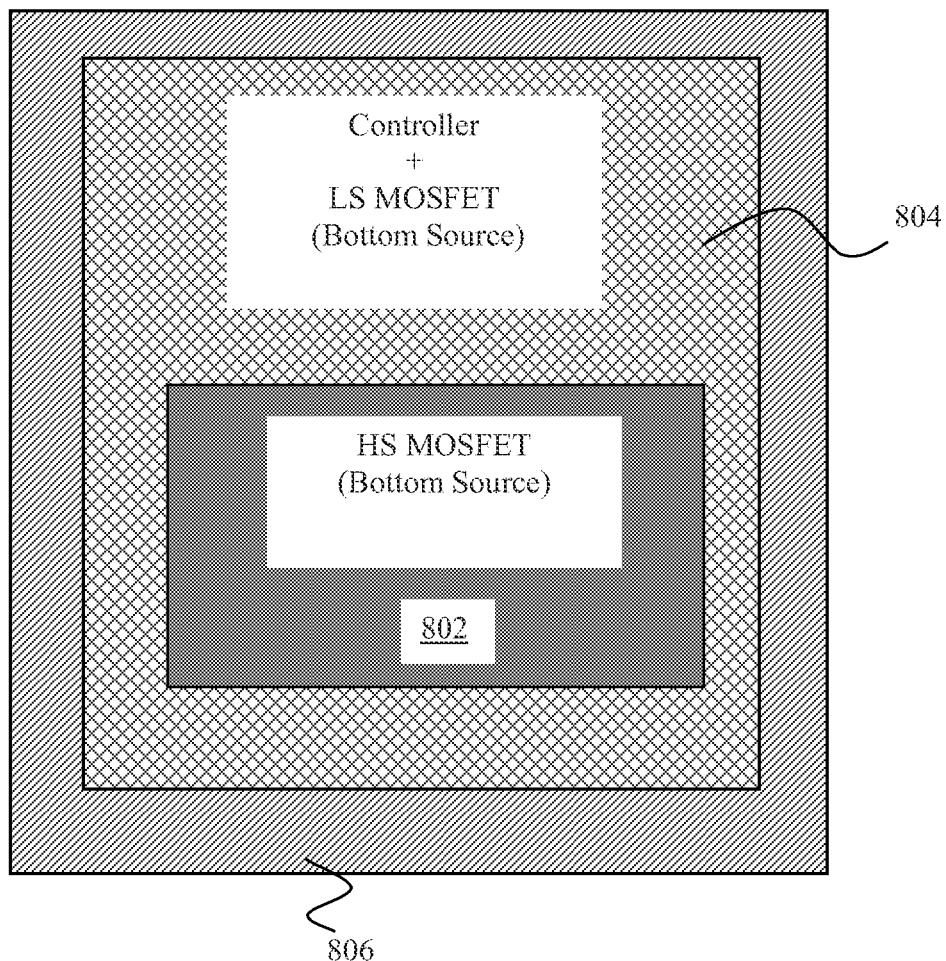
FIG. 11A is a top view illustrating a second alternative single die pad converter using LDMOS with the bottom source of the present invention.
Figure 11B:
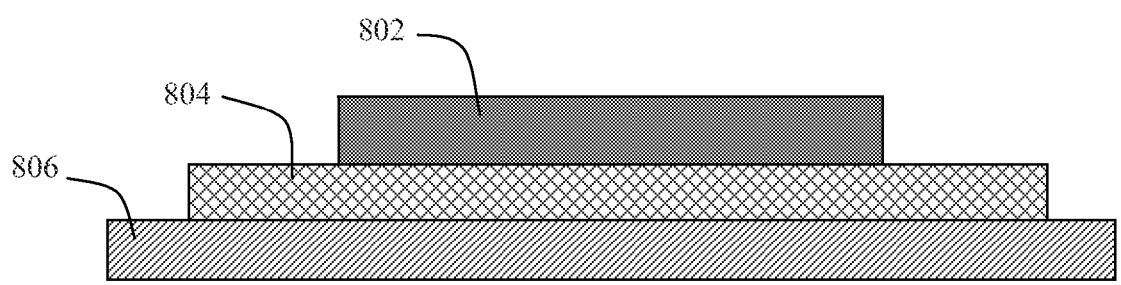
FIG. 11B is a side view of the single die pad converter of FIG. 11A.

The bottom source MOSFET of the present invention can be applied for both HS and LS MOSFETs for one converter package, FIGS. 11A-11B are top view and side view of a single pad converter package. In this configuration, the bottom source HS MOSFET 802 is stacked on top of the top drain of a bottom source LS MOSFET 804, which is electrically and physically connected to a single die pad 806 along with a controller.

The single die pad power converter may be used in many different applications that use high-side and low-side devices, such as power converter circuits, audio amplification circuits, radio frequency (RF) amplification circuits and operational amplifier (op-amp) output stages.

It should be understood that the foregoing description is merely an example of the invention and that modifications may be made thereto without departing from the spirit and scope of the invention and should not be construed as limiting the scope of the invention. For example, though N-channel devices are described, it should be clear to one skilled in the art that the invention can also apply to P-channel devices, e.g., by reversing the conductivity types of the semiconductor regions. The scope of the invention, therefore, should be determined with respect to the appended claims, including the full scope of equivalents thereof.

The invention claimed is:

1. A field effect transistor comprising:
   a semiconductor substrate having formed thereon gate, source and drain regions, with said gate region having a lateral gate channel;
   one or more trenches having electrically conductive plugs formed therein that are in electrical communication with said gate, source and drain regions, wherein said one or more trenches extend from a back surface of said substrate, disposed opposite to a surface upon which the gate, source and drain regions are formed, toward the gate region, with the one or more trenches comprising a plurality of spaced-apart trenches, one of which is a contact trench shorting said source region to said source contact;
   a source contact in electrical communication with said source region;
   a drain contact in electrical communication with said drain region, with said source and drain contacts being disposed on opposite sides of said gate channel; and
   a gate contact, a first semiconductor layer formed upon said substrate, with said gate, source and drain regions further including a second semiconductor layer disposed over said first semiconductor layer, with said first semiconductor layer, second semiconductor layer and said substrate having a first conductivity type associated therewith, wherein a doping concentration of said first semiconductor layer is higher than a do in concentration of said second semiconductor layer.

2. The transistor as recited in claim 1 wherein said trench contact is disposed between said source and drain contacts.

3. The transistor as recited in claim 1 wherein said semiconductor substrate has first and second opposed sides with said gate, source and drain regions formed on said first opposed side and said one or more trenches extending from said lateral gate channel through said substrate and terminating in an one or more openings formed on said second opposed side.

4. The transistor as recited in claim 1 wherein a first portion of said second semiconductor layer has a first conductivity type associated therewith and a second portion of which has a second conductivity type associated therewith, which is opposite to said first conductivity type.

5. The transistor as recited in claim 1 wherein said plurality of spaced-apart trenches extends from said bottom surface of said substrate and terminate in said first semiconductor layer.

6. The transistor as recited in claim 1 wherein said second semiconductor layer comprises a first portion of which has a first conductivity type associated therewith and a second portion of which has a second conductivity type associated therewith, which is opposite to said first conductivity type, wherein said source region is formed on a top portion of said first portion and said drain region is formed on a top portion of said second portion.

7. The transistor as recited in claim 6, wherein said trench contact shorts said source region to said first portion.

8. The transistor as recited in claim 1, wherein said one or more trenches extend from said back surface of said substrate to said source region.

9. The transistor as recited in claim 1 wherein said first semiconductor layer comprises a first portion with a high dope concentration and a second portion with a low dope concentration, wherein a Schottky contact is formed at a junction of said second region and said conductive plugs.

10. A field effect transistor comprising:
a semiconductor substrate having formed thereon gate, source and drain regions, with said gate region having a lateral gate channel, a first semiconductor layer formed upon said substrate, with said first semiconductor layer and said substrate having a first conductivity type associated therewith and disposing over said first semiconductor layer a second semiconductor layer to form said gate, source and drain regions, with said second semiconductor layer having multiple regions of differing conductivity types, defining a super-junction structure in electrical communication with said source and drain regions;
one or more trenches having electrically conductive plugs formed therein that are in electrical communication with said gate, source and drain regions, wherein said one or more trenches extend from a back surface of said substrate, disposed opposite to a surface upon which the gate, source and drain regions are formed, toward the gate region;
a source contact in electrical communication with said source region;
a drain contact in electrical communication with said drain region, with said source and drain contacts being disposed on opposite sides of said gate channel; and
a gate contact.

11. The transistor as recited in claim 10 wherein said second semiconductor layer has multiple regions of differing conductivity types, with a first region of said multiple regions being disposed between a second and third region and having a conductivity type associated therewith that is the same as said first semiconductor layer and opposite to a conductivity type associated with said second and third regions.

12. The transistor as recited in claim 10 wherein said second semiconductor layer has multiple regions of differing conductivity types, with a first region of said multiple regions being disposed between a second and third region and having a conductivity type associated therewith that is the same as said first semiconductor layer and opposite to a conductivity type associated with said second and third regions, said second region being disposed between said first region and said first semiconductor layer.

13. The transistor as recited in claim 10 wherein said second semiconductor layer has multiple regions of differing conductivity types, defining a super-junction structure in electrical communication with said gate, source and drain regions, with each of said multiple regions extending from said first semiconductor layer toward said source contact.

14. A field effect transistor comprising:
a semiconductor substrate having formed thereon gate, source and drain regions, with said gate region having a lateral gate channel;
one or more trenches having electrically conductive plugs formed therein that are in electrical communication with said gate, source and drain regions, wherein said one or more trenches extend from a back surface of said substrate, disposed opposite to a surface upon which the gate, source and drain regions are formed, toward the gate region, with the one or more trenches comprising a plurality of spaced-apart trenches, one of which is a contact trench shorting said source region to said source contact;
a source contact in electrical communication with said source region;
a drain contact in electrical communication with said drain region, with said source and drain contacts being disposed on opposite sides of said gate channel; and
a gate contact, a first semiconductor layer formed upon said substrate, with said gate, source and drain regions further including a second semiconductor layer disposed over said first semiconductor layer, with said first semiconductor layer, second semiconductor layer and said substrate having a first conductivity type associated therewith, wherein a doping concentration of said first semiconductor layer is higher than a doping concentration of said second semiconductor layer, with said trench contact being disposed between said source and drain contacts and said semiconductor substrate has first and second opposed sides with said gate, source and drain regions formed on said first opposed side and said one or more trenches extending from said lateral gate channel through said substrate and terminating in an one or more openings being formed on said second opposed side.

15. The transistor as recited in claim 14 wherein a first portion of said second semiconductor layer has a first conductivity type associated therewith and a second portion of which has a second conductivity type associated therewith, which is opposite to said first conductivity type.

16. The transistor as recited in claim 14 wherein said plurality of spaced-apart trenches extends from said bottom surface of said substrate and terminate in said first semiconductor layer.

17. The transistor as recited in claim 14 wherein said second semiconductor layer comprises a first portion of which has a first conductivity type associated therewith and a second portion of which has a second conductivity type associated therewith, which is opposite to said first conductivity type, wherein said source region is formed on a top portion of said first portion and said drain region is formed on a top portion of said second portion.

18. The transistor as recited in claim 17 wherein said trench contact shorts said source region to said first portion.

19. The transistor as recited in claim 14 wherein said one or more trenches extend from said back surface of said substrate to said source region.

20. The transistor as recited in claim 14 wherein said first semiconductor layer comprises a first portion with a high dope concentration and a second portion with a low dope concentration, wherein a Schottky contact is formed at a junction of said second region and said conductive plugs.

21. The transistor as recited in claim 14 wherein said second semiconductor layer has multiple regions of differing conductivity types, defining a super-junction structure in electrical communication with said source and drain regions.

22. The transistor as recited in claim 14 wherein second semiconductor layer has multiple regions of differing conductivity types, with a first region of said multiple regions being disposed between a second and third region and having a conductivity type associated therewith that is the same as said first semiconductor layer and opposite to a conductivity type associated with said second and third regions.

23. The transistor as recited in claim 1 wherein said second semiconductor layer has multiple regions of differing conductivity types, with a first region of said multiple regions being disposed between a second and third region and having a conductivity type associated therewith that is the same as said first semiconductor layer and opposite to a conductivity type associated with said second and third regions, said second region being disposed between said first region and said first semiconductor layer.

* * * * *